(12) United States Patent
Seng et al.

(10) Patent No.: US 6,318,354 B1
(45) Date of Patent: Nov. 20, 2001

(54) SINGULATION SYSTEM FOR A BGA PRODUCT

(75) Inventors: Wei-Chun Seng, Taichung Hsien; David Wu, Taichung; Hugo Chen, Kaohsiung; Venus Chen; James Chien, both of Taichung; Boss Ko, Taichung Hsien, all of (TW)

(73) Assignee: Uni-Tek System, Inc., Taipei (TW)

( * ) Notice: Subject to any disclaimer, the term of this patent is extended or adjusted under 35 U.S.C. 154(b) by 0 days.

(21) Appl. No.: 09/588,320

(22) Filed: Jun. 6, 2000

(51) Int. Cl.⁷ ............................................... B28D 1/02
(52) U.S. Cl. ......................... 125/20; 451/339; 125/23.01
(58) Field of Search ........................ 125/20, 12, 35, 125/24, 23.01; 451/339, 331, 333, 336, 388; 29/841, 840, 830, 827; 438/110, 111, 112, 113, 121, 123, 125, 126, 107

(56) References Cited

U.S. PATENT DOCUMENTS

| | | | |
|---|---|---|---|
| 5,852,870 | * 12/1998 | Freyman et al. | 29/841 |
| 6,020,218 | * 2/2000 | Shim et al. | 438/111 |
| 6,124,637 | * 9/2000 | Freyman et al. | 257/736 |

* cited by examiner

Primary Examiner—Derris H. Banks
(74) Attorney, Agent, or Firm—Rosenberg, Klein & Lee

(57) ABSTRACT

A singulation system for a BGA product is disclosed, which has a cutting mechanism with a cutting head, a conveyor belt arranged under the cutting head, a cutting table positioned to connect with the conveyor belt, a cleaning station positioned beside the cutting mechanism, a loading frame capable of moving up and down and positioned beside the cleaning station, a cassette storage containing multiple receiving cassettes (each having a BGA product contained therein) and positioned to abut one end of the loading frame, a gripping device arranged at the other end of the loading frame, and a revolving arm assembly arranged among the cutting table, the cleaning station and the loading frame and comprising three revolving arms each having a pivotal end and a distal end respectively extending above the cutting table, the cleaning station and the loading frame with each distal end having a suction device mounted thereon.

2 Claims, 9 Drawing Sheets

SINGULATION SYSTEM FOR A BGA PRODUCT

BACKGROUND OF THE INVENTION

1. Field of the Invention

The present invention relates to a singulation system for a BGA (ball grid array) product, more particularly, to a singulation system for a BGA product containing an revolving arm assembly.

2. Description of Related Art

Since there is no special singulation device for BGA production, the current solution is to use the procedure and equipment for cutting wafers. However, the high cost of the equipment for cutting wafers has driven BGA producers to placing a high priority on identifying low cost but tough alternatives.

Therefore, there is a need for a singulation system specifically for BGA products, which can smooth and accelerate the cutting process for BGA products.

SUMMARY OF THE INVENTION

The objective of the present invention is to provide a singulation system for BGA products, which can smooth and accelerate the cutting process for BGA products.

To achieve the objective, the singulation system for a BGA product in accordance with the present invention comprises a cutting mechanism having a cutting head, a conveyor belt, a cutting table, a cleaning station, a loading frame capable of moving up and down, a cassette storage containing multiple receiving cassettes (each having a BGA product contained therein), a gripping device and an revolving arm assembly with three revolving arms.

When the singulation system for BGA products in accordance with the present invention is operated, the loading frame is lifted or lowered to align with a receiving cassette containing the BGA product to be cut. Then the gripping device grips the receiving cassette in the cassette storage and pulls it along the loading frame to a predetermined position. The revolving arm assembly will simultaneously remove the receiving cassettes on the cutting table and on the cleaning station and place the new cassette on the cutting table. Thus, multiple BGA receiving cassettes, instead of only one BGA receiving cassette, are removed in a cutting operation so as to accelerate and smooth the cutting procedure.

Obviously, the square singulation table and loading frames are the most impression features for potential users. It not only provides a compact working area but also makes the singulation work more flexible and effective. Conventional devices and procedures require four times the mounting space and the requisite software design support.

Other objectives, advantages, and novel features of the invention will become more apparent from the following detailed description when taken in conjunction with the accompanying drawings.

DETAILED DESCRIPTION OF THE PREFERRED EMBODIMENT

Figure 1:
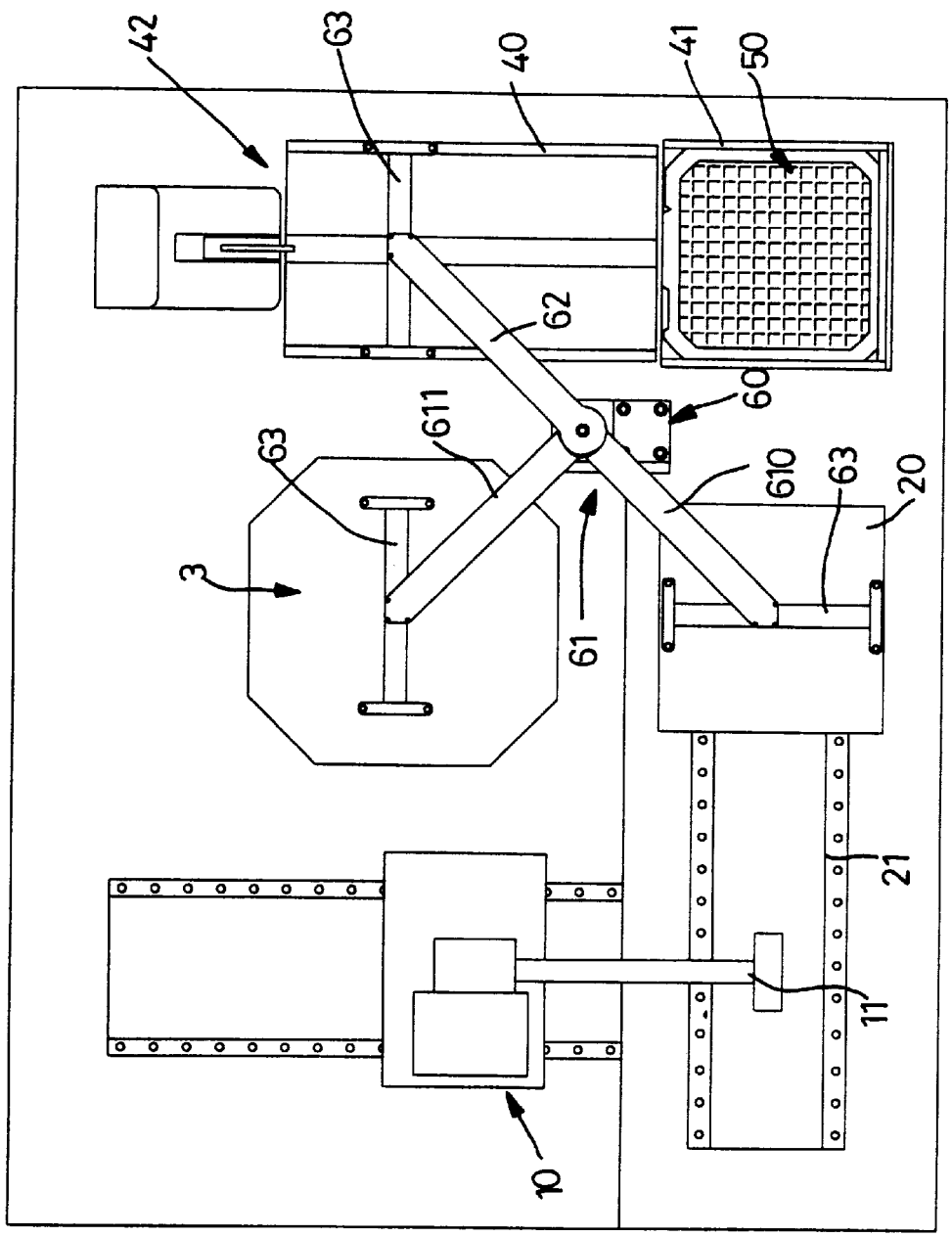
FIG. 1 is a schematic top plain view of the singulation system for a BGA product in accordance with the present invention.

With reference to FIG. 1, the singulation system for a BGA product in accordance with the present invention comprises a cutting mechanism (10), a conveyor belt (21), a cutting table (20), a cleaning station (30), a loading frame (40), a cassette storage (41), a gripping device (42) and a revolving arm assembly (60). These elements of the singulation system for a BGA product are arranged on a square singulation table.

The cutting mechanism (10) contains a cutting head (11) extending to a position above the conveyor belt (21). The cutting head (11) is used to cut the BGA product held in a receiving cassette (50) that is originally stored in the cassette storage (41).

The conveyor belt (21) can move reciprocally by a drive device (not shown).

The cutting table (20) is located on the conveyor belt (21) and is used to carry a receiving cassette (50). The cutting table (20) can be transported from an original position to a position under the cutting head (11) by the conveyor belt (21).

The cleaning station (30) is located between the cutting mechanism (10) and the gripping device (42) and is aligned with the cutting table (20). The BGA product can be washed and dried at the cleaning station (30) after being cut.

The loading frame (40) is located on the right side of the cleaning station (30). The loading frame (40) can be lifted or lowered to align with a receiving cassette (50) stored in the cassette storage (41).

The cassette storage (41) is positioned to connect with one end of the loading frame (40). The cassette storage (41) contains multiple receiving cassettes (50) that hold the BGA products to be cut. When the loading frame (40) is lifted or lowered, a receiving cassette (50) will be aligned with one end of the loading frame (40).

The gripping device (42) is located at the other end of the loading frame (40) and is used to grip a receiving cassette (50) and pull the receiving cassette (50) from the cassette storage (41) along the loading frame (40) to a predetermined position.

The revolving arm assembly (60) is located among the cutting table (20), the cleaning station (30) and the loading frame (40). The revolving arm assembly (60) consists of three revolving arms (62, 610 and 611). Each arm (62, 610 and 611) has a pivot end and a distal end. The pivot ends of the arms (610 and 611) are fixedly connected to each other at a right angle to form a set of double arms (61). Thus, arms (610, 611) in the set of double arms (61) will revolve together in the same direction while the single arm (62) can simultaneously revolve in a different direction.

The single arm (62) has a distal end extending to a position above the loading frame (40). The first arm (610) in the set of double arms (61) has a distal end extending to a position above the cutting table (20), and the second arm (611) has a distal end extending to a position above the cleaning station (30). A suction device (63) is mounted on the distal end of each arm (62, 610 and 611).

Figure 2:
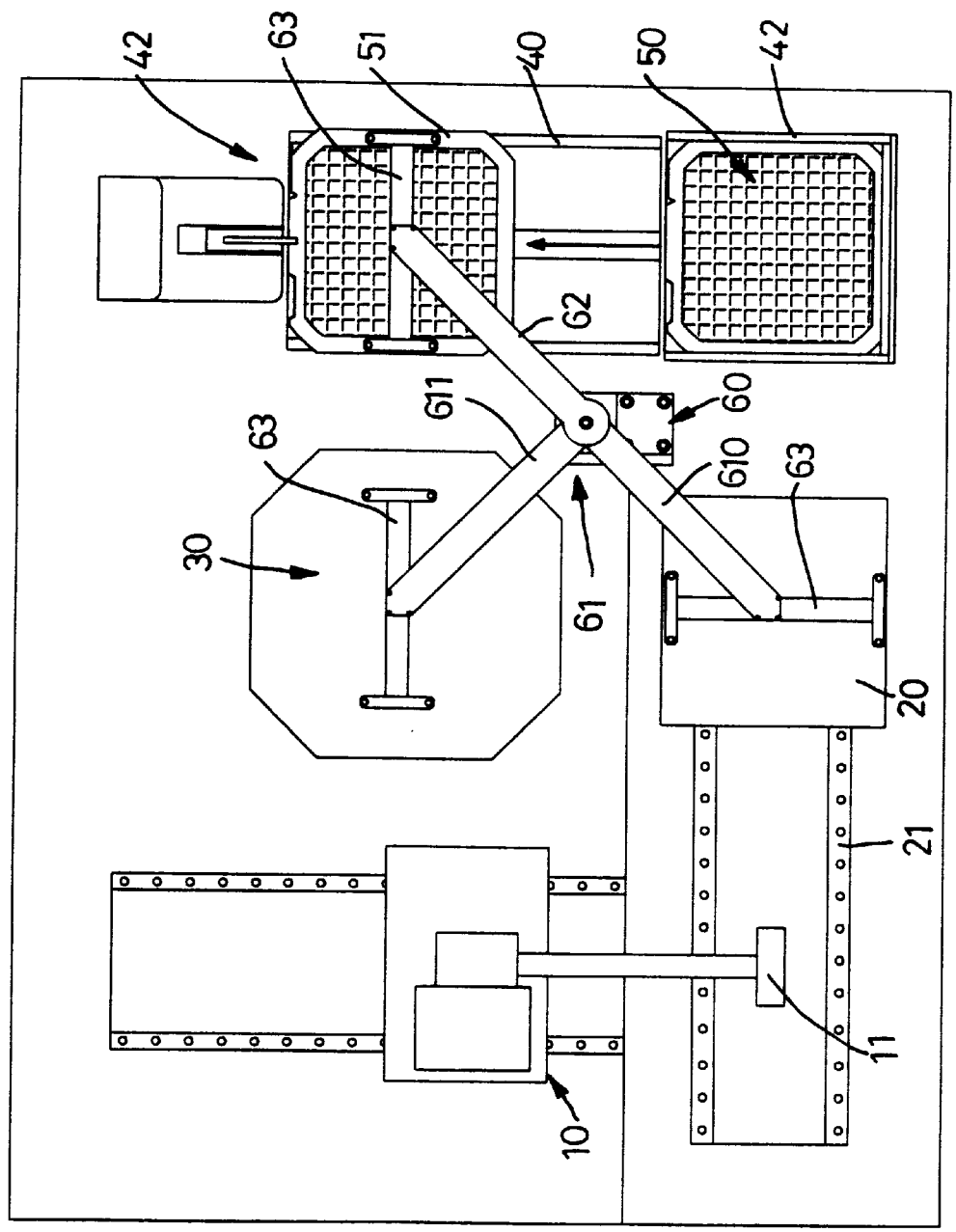
FIG. 2 is a schematic top plain view of the first action of the singulation system for a BGA product in accordance with the present invention.
Figure 3:
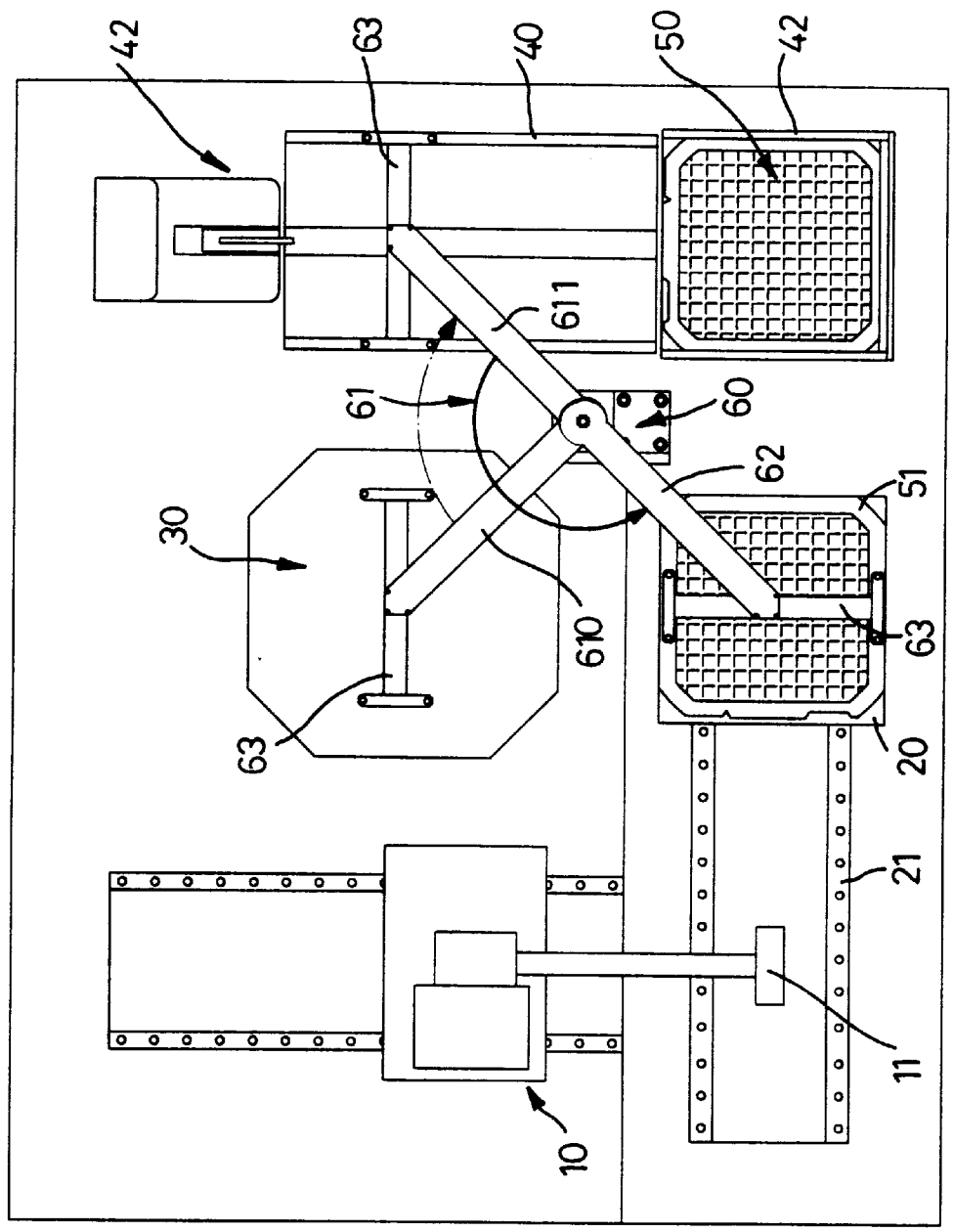
FIG. 3 is a schematic top plain view of the second action of the singulation system for a BGA product in accordance with the present invention.

With reference to FIGS. 1 to 4, when the singulation system for a BGA product is operated, the gripping device (42) will grip a first receiving cassette (51) in the cassette storage (41) and pull the receiving cassette (51) along the loading frame (40) to a predetermined position. As shown in FIG. 2, this predetermined position is under the distal end of the single arm (62). Then the suction device (63) mounted on the distal end of the single arm (62) will attach to the first receiving cassette (51). The suction on the first receiving cassette (51) by the suction device (63) will automatically drive the revolving arm assembly (60) to rotate. The distal end of the single arm (62) will rotate 180° from a position above the loading frame (40) to a position above the cutting table (20) together with a 90° rotation of the arms of the set of double arms (61), such that the distal end of each of the arms (610, 611) respectively rotates to a position above the cleaning station (30) and the loading frame (40) (see FIG. 3). Then, the suction device (63) will release the first receiving cassette (51) on the cutting table (20). Then the distal end of the single arm (62) will rotate 180° back to a position above the loading frame (40), and the arms (610, 611) in the double set of arms (61) simultaneously rotate 90° back to positions above the cutting table (20) and the cleaning station (30) (see FIG. 4).

Figure 4:
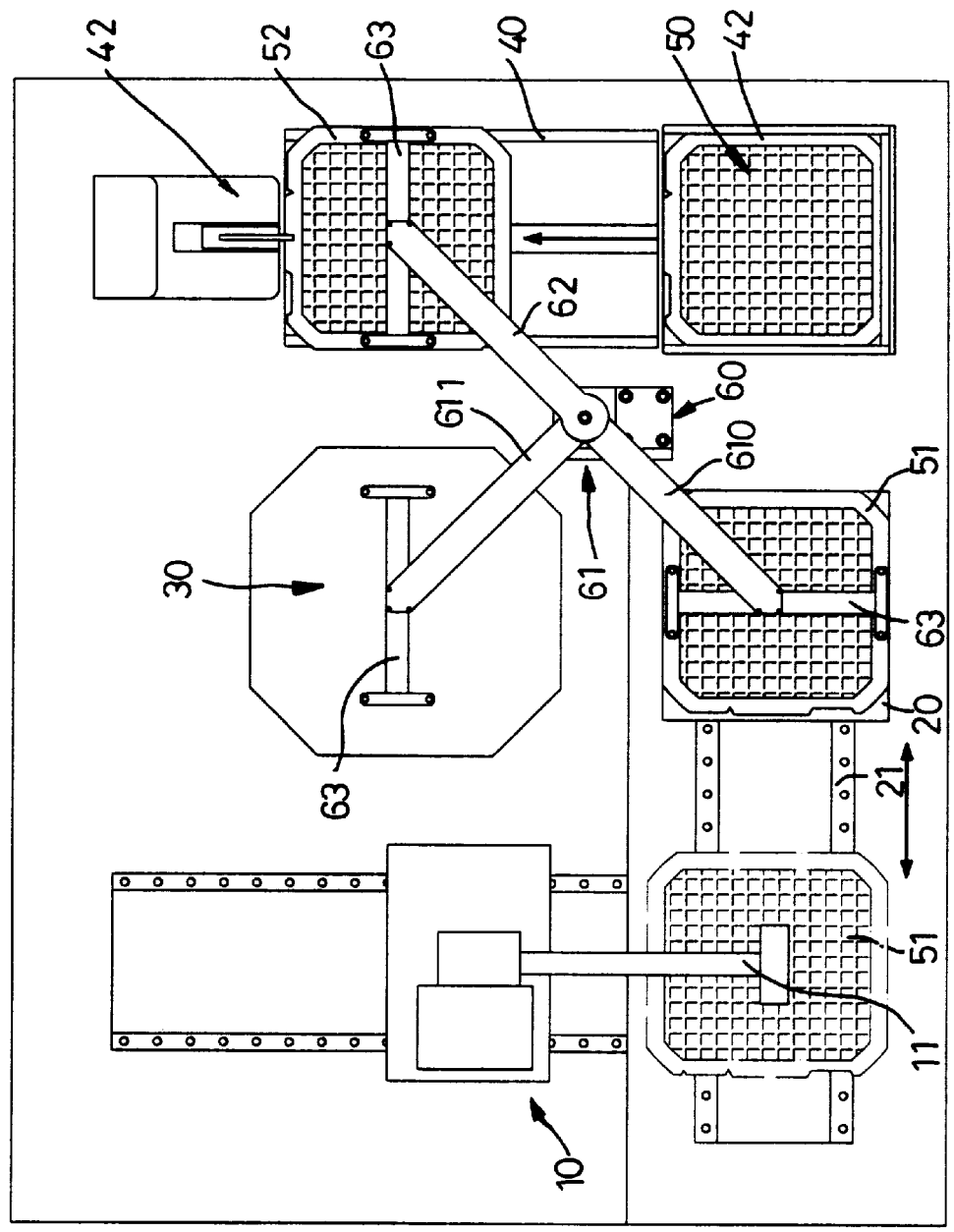
FIG. 4 is a schematic top plain view of the third action of the singulation system for a BGA product in accordance with the present invention.
Figure 5:
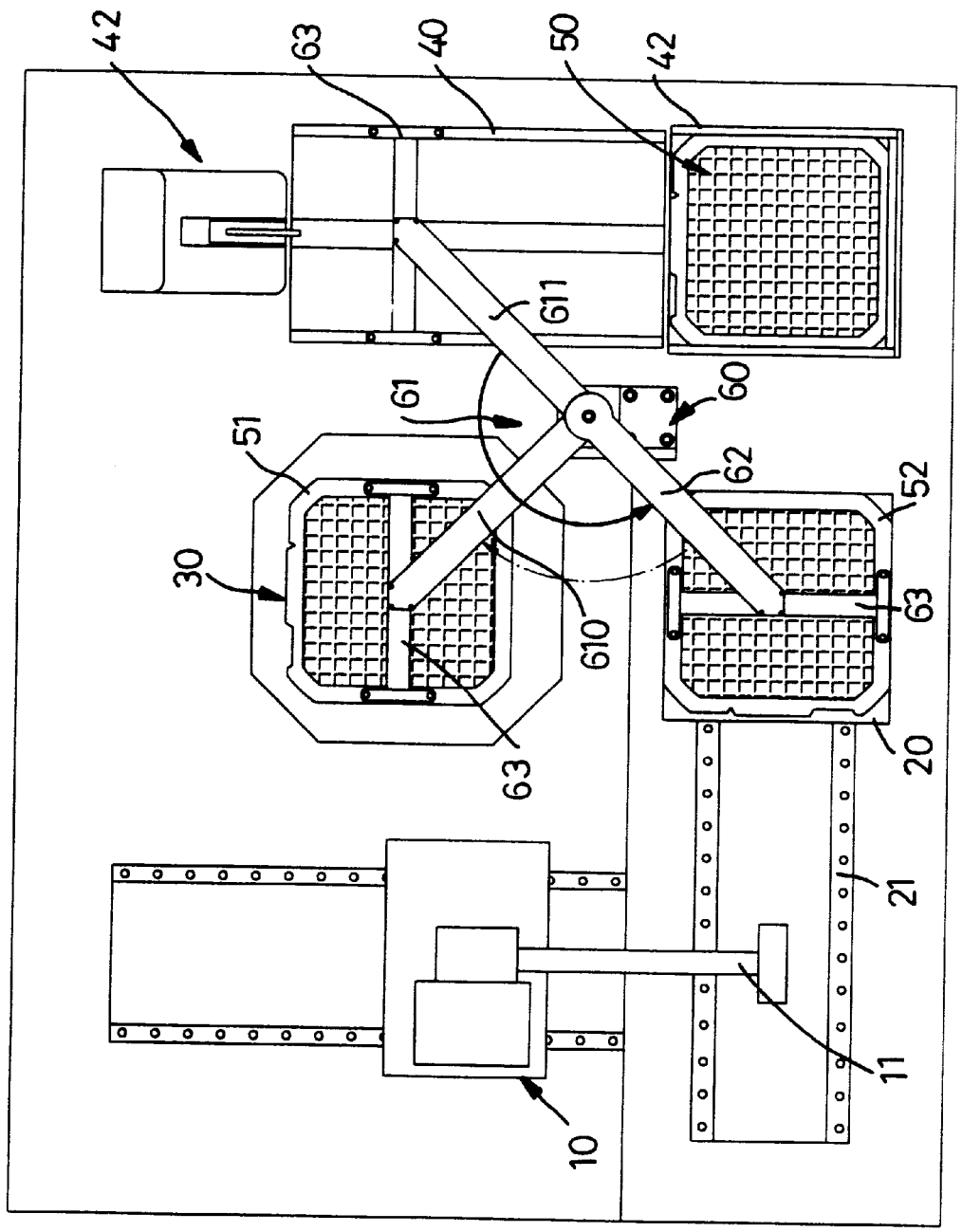
FIG. 5 is a schematic top plain view of the fourth action of the singulation system for a BGA product in accordance with the present invention.
Figure 6:
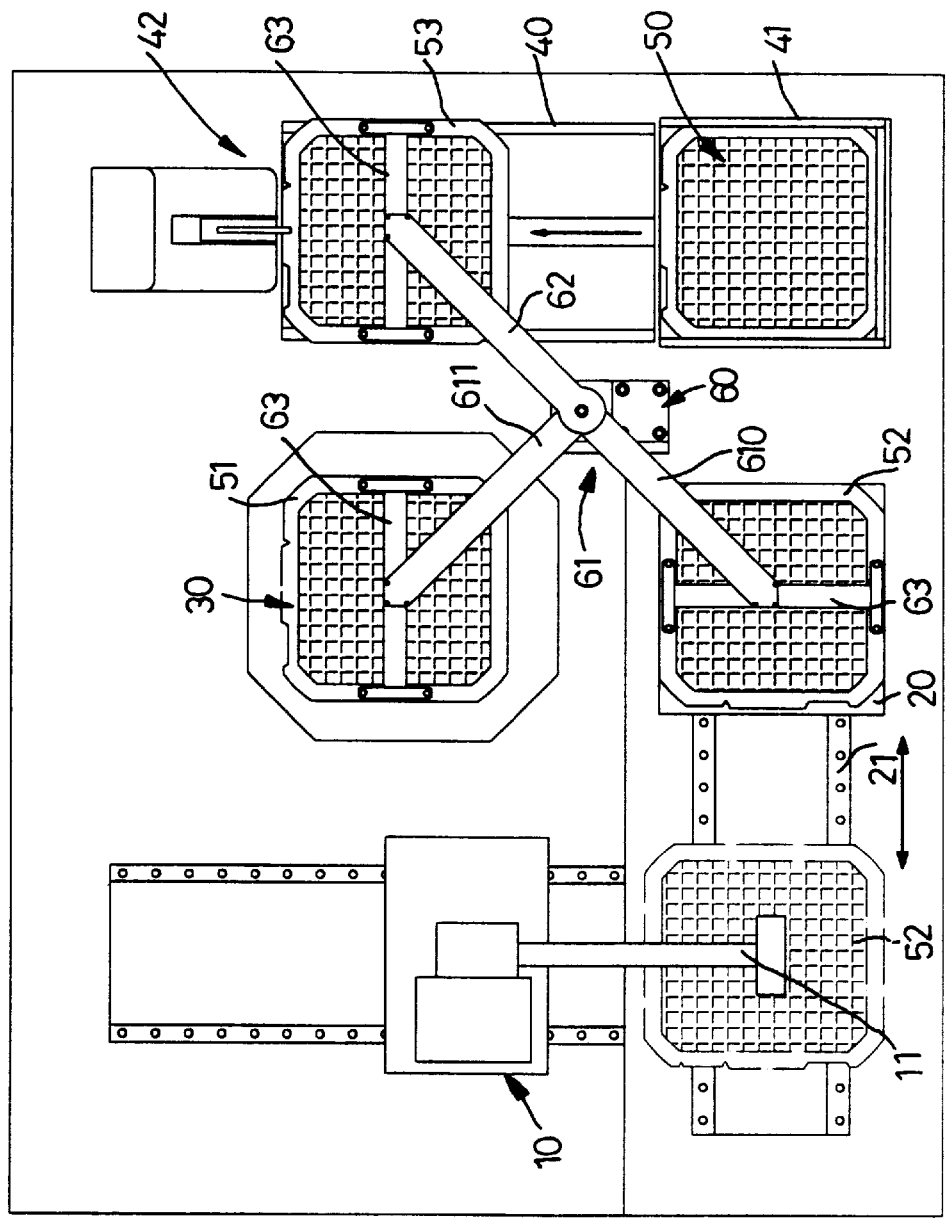
FIG. 6 is a schematic top plain view of the fifth action of the singulation system for a BGA product in accordance with the present invention.

With reference to FIGS. 4 to 6, when the first receiving cassette (51) is placed on the cutting table (20) (see FIG. 4), the cutting table (20) together with the receiving cassette (51) carried thereon will be conveyed from the original position to a position under the cutting head (11) by the conveyor belt (21) (see the dotted line in FIG. 4). Meanwhile, the gripping device (42) will attach to and pull a second receiving cassette (52) from the cassette storage (50) along the loading frame (40) to the predetermined position and stands by there (see FIG. 4).

After completely cutting the BGA product in the first receiving cassette (51), the cutting table (20) together with the first receiving cassette (51) will return to the original position of the cutting table (20). Then, the suction devices (63) on one of the arms (610) in the set of double arms (61) and the single arm (62) will respectively attach to the first and the second receiving cassettes (51, 52). The two arms (610, 62) will rotate 90° and 180° to move the first receiving cassette (51) and the second receiving cassette (52) to positions above the cleaning station (30) and the cutting table (20), respectively (see FIG. 5). After the first and the second receiving cassettes (51, 52) are respectively laid on the cleaning station (30) and the cutting table (20), the first arm (610) and the single arm (62) will respectively return to their original positions (see FIG. 6).

Figure 7:
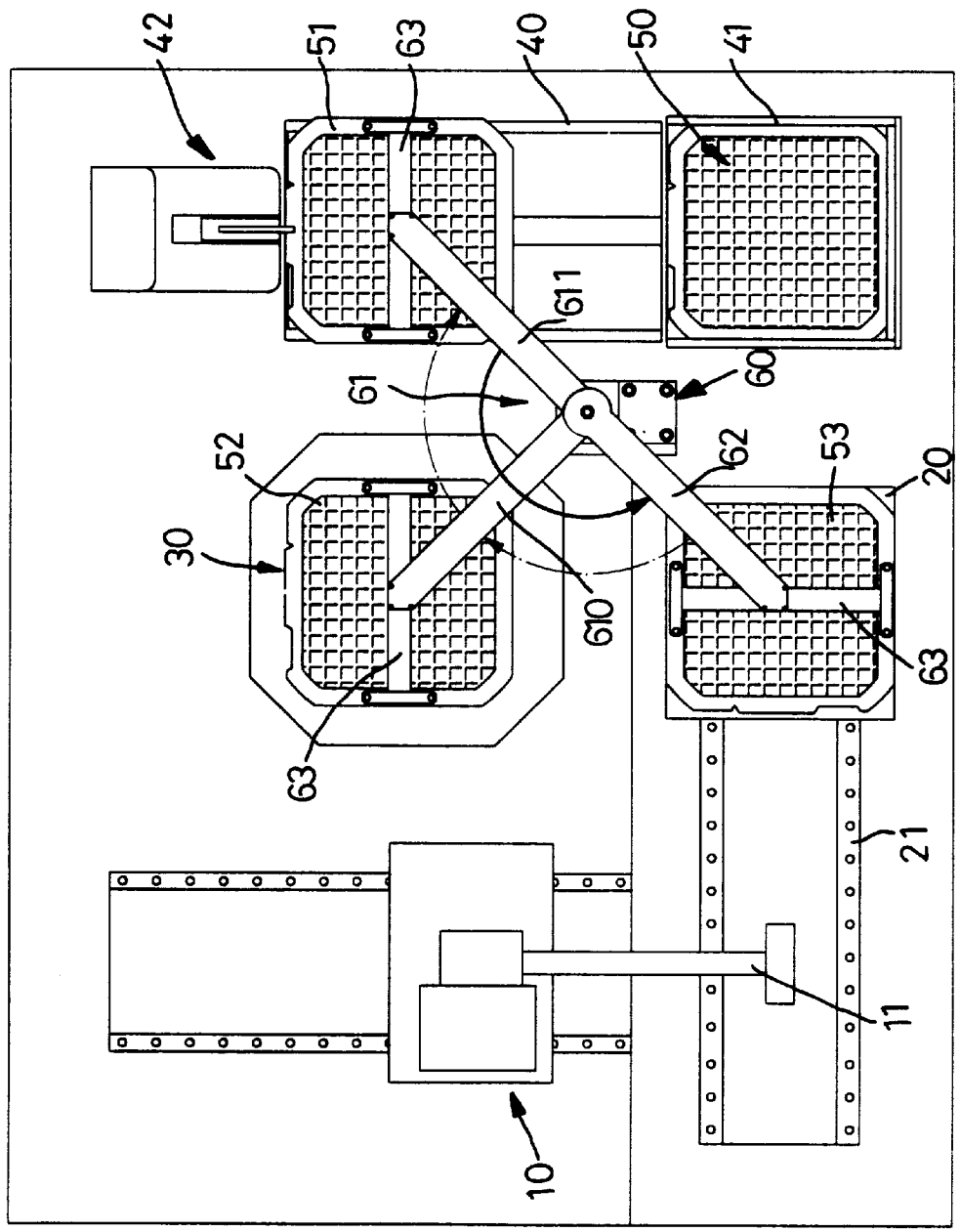
FIG. 7 is a schematic top plain view of the sixth action of the singulation system for a BGA product in accordance with the present invention.
Figure 8:
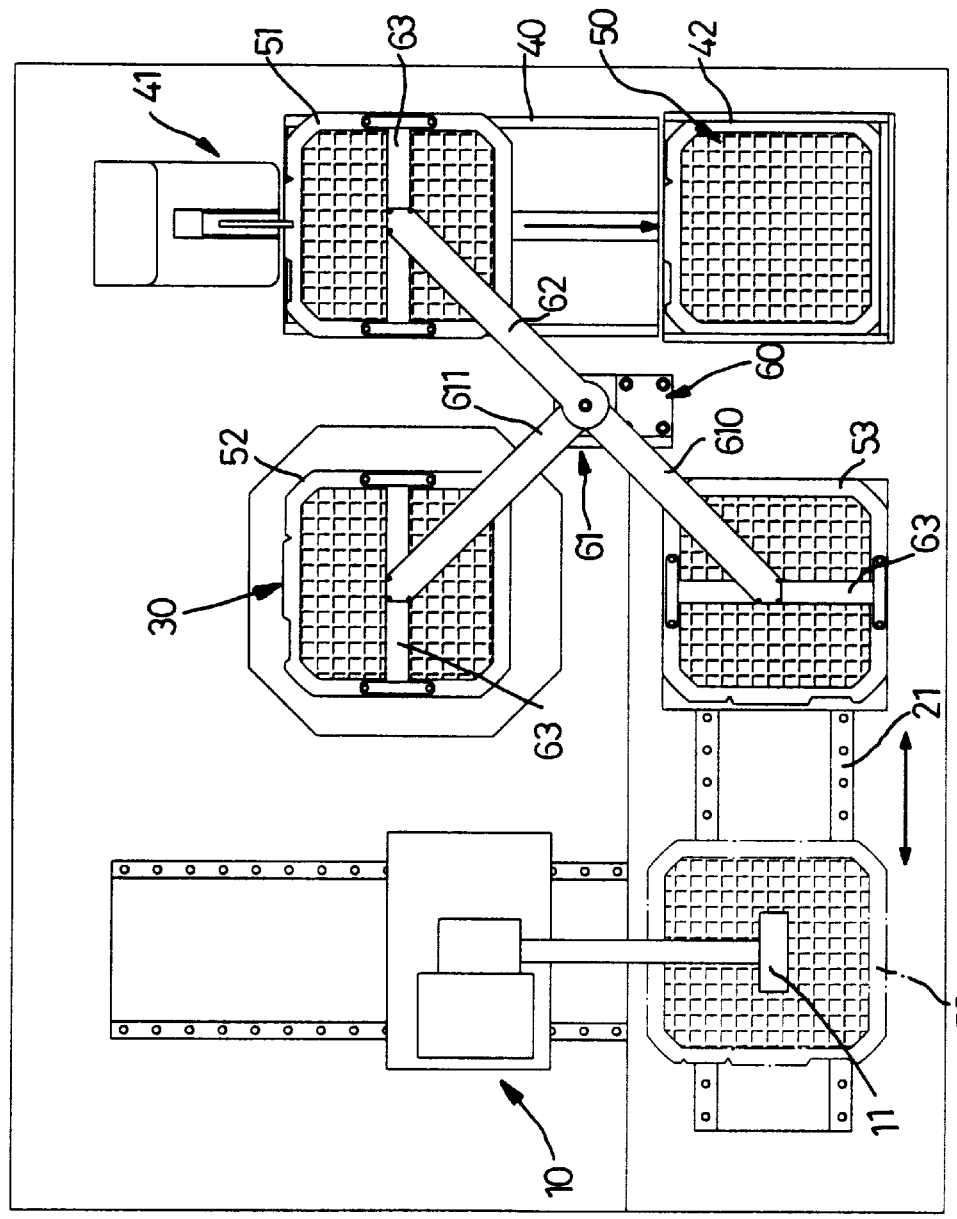
FIG. 8 is a schematic top plain view of the seventh action of the singulation system for a BGA product in accordance with the present invention.

With reference to FIGS. 6 to 8, the BGA product in the first receiving cassette (51) is cleaned in the cleaning station (30) (see FIG. 6); and the BGA product in the second receiving cassette (52) will be placed on the cutting table (20) and transported to a position under the cutting head (11) (see the dotted line in FIG. 6). Meanwhile, the gripping device (42) will grip a third receiving cassette (53) in the cassette storage (41) and move the third receiving cassette (53) from the cassette storage (41) to the predetermined position on the loading frame (40) and stand by there (see FIG. 6).

After the BGA product in the first receiving cassette (51) is cleaned and the second receiving cassette (52) is cut and returns to its original position, the suction devices (63) on the arms (610 and 611) in the double set of arms (61) is driven to respectively attach to the second and the first receiving cassettes (52 and 51). Then, the arms (62, 610 and 611) will rotates 180° or 90° to respectively move the first, the second and the third receiving cassettes (51, 52 and 53) to a position above the loading frame (40), the cleaning station (30) and the cutting table (20), respectively (see FIG. 7). Then, the first, the second and the third receiving cassettes (51, 52 and 53) are respectively released from the suction device (63) and laid on the loading frame (40), the cleaning station (30) and the cutting table (20), respectively. After releasing the receiving cassettes (51,52 and 53), each of the arms (62, 610 and 611) will respectively again rotate back to the positions above the loading frame (40), the cutting table (20) and the cleaning station (30) (see FIG. 8).

Figure 9:
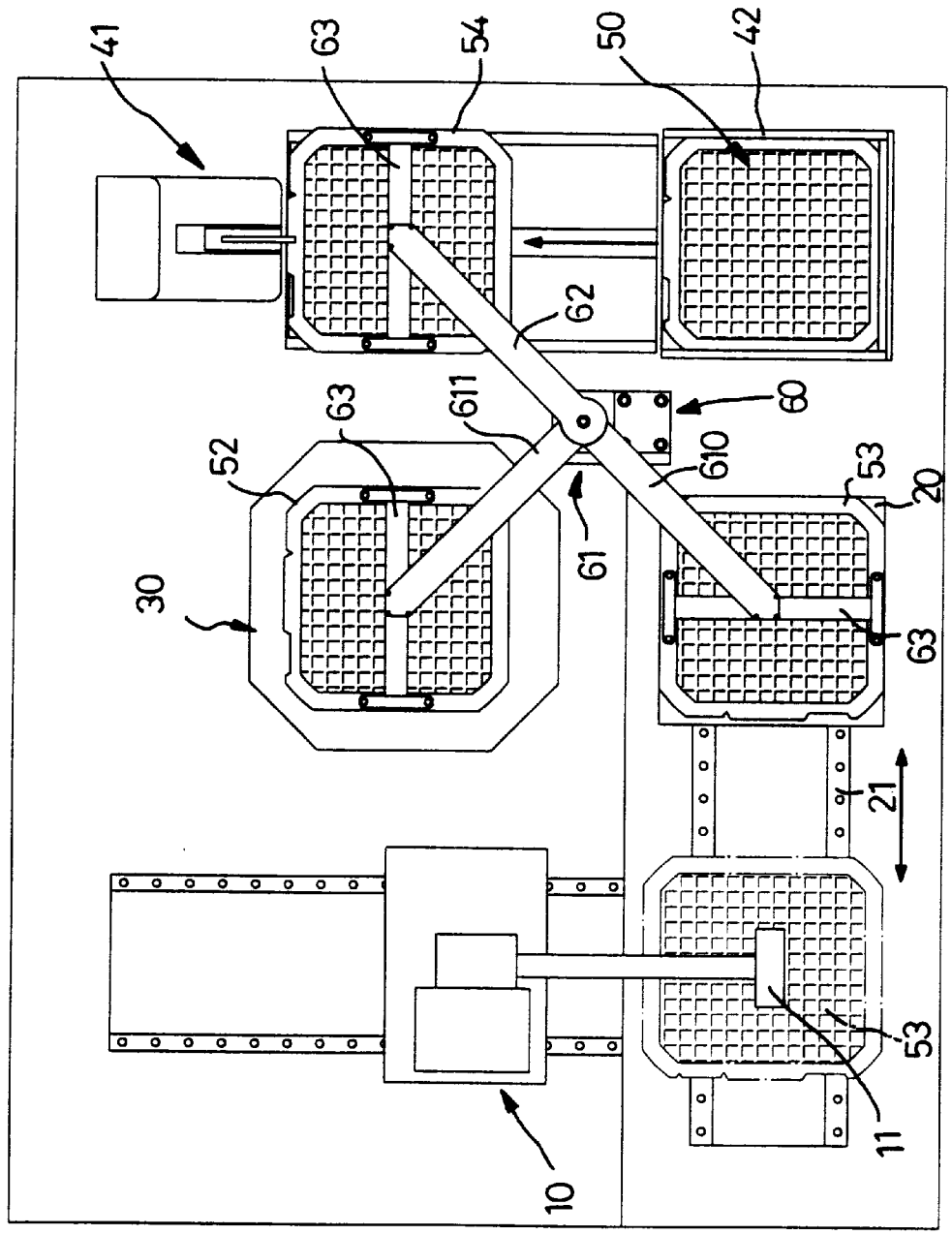
FIG. 9 is a schematic top plain view of the eighth action of the singulation system for a BGA product in accordance with the present invention.

With reference to FIGS. 8 and 9, the first receiving cassette (51) is pushed back into the cassette storage (41) along the loading frame (40) by the gripping device (42). After the cassette storage (41) indexes the fourth receiving cassette (54), the gripping device (42) will grip the fourth receiving cassette (54) from the cassette storage (41) and move the fourth receiving cassette (54) to the predetermined position on the support frame (40) and stand by (see FIG. 9). Meanwhile, the BGA products in the second and the third receiving cassette (52, 53) are respectively cleaned and cut in the cleaning station (30) and the cutting table (20) (see FIG. 9).

With the singulation system for a BGA product in accordance with the present invention, BGA products can be drawn out of the cassette storage (41), cut and cleaned in one operation of the revolving arm assembly (60) and thus accelerate and smooth the cutting operation for BGA products.

Although the present invention has been explained in relation to its preferred embodiment, it is to be understood that many other possible modifications and variations can be made without departing from the spirit and scope of the invention as hereinafter claimed.

What is claimed is:

1. A singulation system for a BGA product, comprising:

a cutting mechanism having a cutting head extending therefrom;

a reciprocally-movable conveyor belt positioned under the cutting head;

a cutting table so positioned to connect with the conveyor belt that the cutting table can be moved by the conveyor belt;

a cleaning station positioned beside the cutting mechanism;

a loading frame capable of moving up and down and positioned beside the cleaning station;

a cassette storage arranged to abut one end of the loading frame and containing multiple receiving cassettes each having a BGA product contained therein;

a gripping device arranged at the other end of the loading frame; and a revolving arm assembly arranged among the cutting table, the cleaning station and the loading frame and comprising three revolving arms each having a pivotal end and a distal end respectively extending above the cutting table, the cleaning station and the loading frame with each distal end having a suction device mounted thereon.

2. The singulation system for a BGA product as claimed in claim 1, wherein the three revolving arms are a single arm and a set of double arms having two arms fixedly connected at a right angle with each other at the pivotal ends.

* * * * *